US008975923B2

(12) United States Patent
Gagne et al.

(10) Patent No.: US 8,975,923 B2
(45) Date of Patent: Mar. 10, 2015

(54) PROTECTIVE MULTIPLEXER

(75) Inventors: Nickole Gagne, Saco, ME (US);
Kenneth P. Snowdon, Falmouth, ME (US)

(73) Assignee: Fairchild Semiconductor Corporation, San Jose, CA (US)

( * ) Notice: Subject to any disclaimer, the term of this patent is extended or adjusted under 35 U.S.C. 154(b) by 250 days.

(21) Appl. No.: 13/589,690

(22) Filed: Aug. 20, 2012

(65) Prior Publication Data

US 2014/0049861 A1 Feb. 20, 2014

(51) Int. Cl.
*H03K 19/094* (2006.01)
(52) U.S. Cl.
USPC .......................................... 326/113; 327/546
(58) Field of Classification Search
None
See application file for complete search history.

(56) References Cited

U.S. PATENT DOCUMENTS

| | | | |
|---|---|---|---|
| 4,093,874 A | 6/1978 | Pollitt | |
| 5,514,994 A | 5/1996 | Sawada | |
| 5,801,577 A | 9/1998 | Tailliet | |
| 5,914,589 A | 6/1999 | Erckert | |
| 6,121,694 A | 9/2000 | Thereze | |
| 6,160,437 A * | 12/2000 | Kim et al. | 327/408 |
| 6,163,199 A * | 12/2000 | Miske et al. | 327/434 |
| 6,225,853 B1 | 5/2001 | Matsushita | |
| 7,436,241 B2 | 10/2008 | Chen et al. | |
| 7,782,117 B2 | 8/2010 | Stultz et al. | |
| 8,536,928 B1 | 9/2013 | Gagne et al. | |
| 8,564,918 B2 * | 10/2013 | Gagne et al. | 361/86 |
| 8,710,900 B2 * | 4/2014 | Gagne et al. | 327/434 |
| 8,779,839 B2 | 7/2014 | Snowdon | |
| 2003/0016072 A1 * | 1/2003 | Ramakrishnan | 327/434 |
| 2006/0202742 A1 | 9/2006 | Aksin et al. | |
| 2011/0199146 A1 * | 8/2011 | Bakalski et al. | 327/427 |
| 2011/0293100 A1 * | 12/2011 | Stultz et al. | 381/28 |
| 2012/0274362 A1 | 11/2012 | Doris et al. | |
| 2013/0009797 A1 | 1/2013 | Grilo et al. | |
| 2013/0049847 A1 | 2/2013 | Glibbery | |
| 2013/0154720 A1 | 6/2013 | Snowdon | |
| 2013/0249621 A1 * | 9/2013 | Gagne et al. | 327/408 |
| 2013/0307591 A1 * | 11/2013 | Daigle et al. | 327/109 |

FOREIGN PATENT DOCUMENTS

| | | |
|---|---|---|
| CN | 103427630 A | 12/2013 |
| CN | 103633988 A | 3/2014 |
| CN | 203482179 U | 3/2014 |
| KR | 1020140024227 A | 2/2014 |

OTHER PUBLICATIONS

U.S. Appl. No. 13/331,332, Non Final Office Action mailed Nov. 8, 2013, 8 pgs.
U.S. Appl. No. 13/331,332, Notice of Allowance mailed Mar. 14, 2014, 5 pgs.

(Continued)

*Primary Examiner* — Jany Richardson
(74) *Attorney, Agent, or Firm* — Schwegman Lundberg & Woessner, P.A.

(57) ABSTRACT

Apparatus and methods for a protective multiplexer, among other things, are provided. In an example, a protective multiplexer circuit can include a first switch that in a first state can be configured to couple an input of a power supply to at least one of first or second signal nodes of a passgate when a first voltage of the at least one of the first or second signal nodes is below a first limit voltage.

18 Claims, 3 Drawing Sheets

(56) References Cited

OTHER PUBLICATIONS

U.S. Appl. No. 13/331,332, Response filed Feb. 10, 2014 to Non Final Office Action mailed Nov. 18, 2013, 8 pgs.
Chinese Application Serial No. 201320292597.2, Office Action mailed Sep. 2, 2013, w/English Claims, 36 pgs.
Chinese Application Serial No. 201320292597.2, Response filed Oct. 9, 2013 to Office Action mailed Sep. 2, 2013, w/English Claims, 25 pgs.
U.S. Appl. No. 13/481,267, Response filed Apri. 15, 2013 to Final Office Action mailed Apr. 4, 2013, 10 pgs.
U.S. Appl. No. 13/481,267, Final Office Action mailed Apr. 4, 2013, 12 pgs.
U.S. Appl. No. 13/481,267, Non Final Office Action mailed Mar. 12, 2013, 12 pgs.
U.S. Appl. No. 13/481,267, Notice of Allowance mailed May 16, 2013, 9 pgs.
U.S. Appl. No. 13/481,267, Response filed Mar. 20, 2013 to Non Final Office Action mailed Mar. 12, 2013, 10 pgs.
Chinese Application Serial No. 201220710553.2, Notification to Make Rectification mailed Apr. 10, 2013, 2 pgs.
Chinese Application Serial No. 201220710553.2, Response filed Apr. 15, 2013 to Notification to Make Rectification mailed Apr. 10, 2013, 5 pgs.

\* cited by examiner

PROTECTIVE MULTIPLEXER

BACKGROUND

Utility of electronic devices can be improved when the electronic device can interface with one or more accessory devices. Physical utility, in the form of small size, can improve when multiple accessory devices can use a common connector of the electronic device. Cost of an electronic device can be minimized when low voltage components can used for the accessory interface. Today's improved electronic devices can have expanded utility, small physical size, and low voltage interface components, however, in certain circumstances, such interfaces can be susceptible to high voltage stress.

Overview

This document discusses, among other things, apparatus and methods for a protective multiplexer. In an example, a protective multiplexer circuit can include a first switch that, in a first state, can be configured to couple an input of a power supply to at least one of first or second signal nodes of a passgate when a first voltage of the at least one of the first or second signal nodes is below a first limit voltage.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present inventors have recognized, among other things, a constant gate-to-source voltage (Vgs) passgate circuit that can be used to pass analog signals with little or no distortion as well as digital signals having substantially different signal reference voltages. In some examples, cost savings and power efficiency can be realized using low-voltage components and a protective multiplexer circuit configured to protect the low voltage components from overvoltage stress and to multiplex an input reference voltage for controlling the passgate. Such protection can be utilized to protect the low-voltage components when analog signal amplitudes can cause overvoltage conditions and when a connector coupled to the passgate is connected incorrectly or is connected in an unanticipated configuration.

Figure 1:
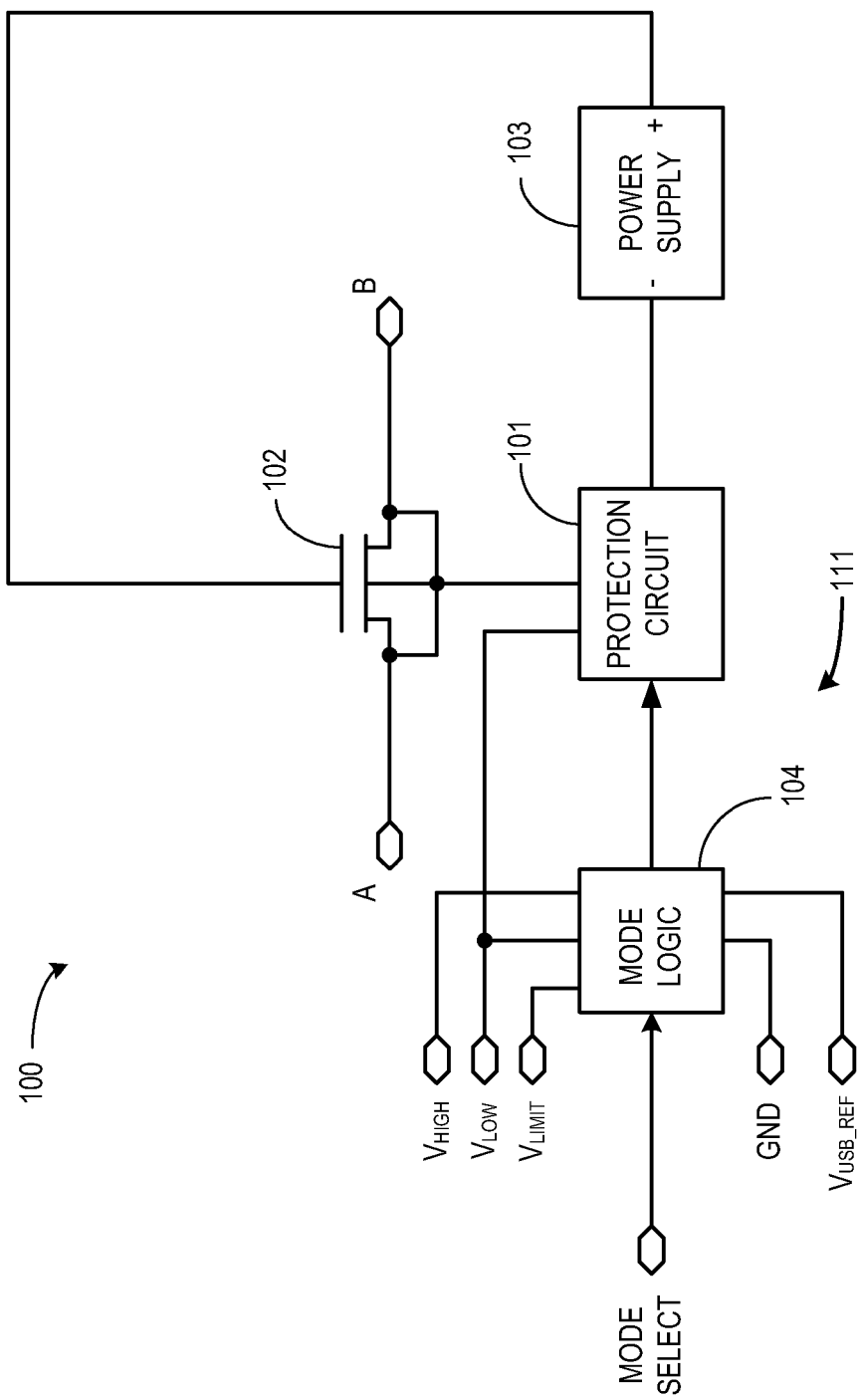
FIG. 1 illustrates generally an example passgate circuit including an example protective multiplexer circuit.

FIG. 1 illustrates generally an example passgate circuit 100 including an example protective multiplexer circuit 111. In certain examples, the passgate circuit 100 can include a passgate, such as a passgate transistor 102, a power supply 103, and a protection circuit 101. In some examples, the passgate circuit 100 can include mode selection logic 104 to enable and select a particular passgate mode. For example, a passgate transistor 102 can be used to pass analog signals such as, but not limited to, analog audio signals or analog video signals. In some examples, the passgate transistor 102 can pass digital signals that conform to a certain protocol, such as, but not limited to, universal serial bus (USB) signals, or mobile high-definition link (MHL) signals. In certain examples, the power supply 103 can be used to maintain a constant gate-to-source voltage (Vgs) of the passgate transistor 102 when the passgate transistor 102 is enabled. A constant Vgs can assure a constant resistance between the switch nodes (A, B) of the passgate transistor 102. Keeping the resistance between the switch nodes (A, B) of the passgate transistor 102 can maintain fidelity and reduce or eliminate distortion of the signal being passed between the switch nodes (A, B). In certain applications, fidelity of the signal, whether an analog signal or a digital signal, can increase the user experience or the signal transfer robustness of a device including the passgate circuit 100.

In certain examples where the passgate circuit 100 is configured to operate in a single mode, the protection circuit 101 can include logic to enable and disable the passgate transistor 102 as well as provide overvoltage stress protection. In certain examples where the passgate circuit 100 can operate in more than one mode, the passgate circuit 100 can include mode selection logic 104 to form a protective multiplexer 111. In some examples, the mode selection logic 104 and the protection circuit 101 can be separate. In some examples, the mode selection logic 104 and the protection circuit 101 of the protective multiplexer 111 can be integrated such that some components provide functionality for mode selection, passgate enable/disable, overvoltage stress protection, or combinations thereof.

Referring again to FIG. 1, in certain examples, the mode selection logic 104 and protection circuit 101 can receive a number of supply and reference voltages ($V_{HIGH}$, $V_{LOW}$, $V_{LIMIT}$, GND, $V_{USB\_REF}$). For overvoltage stress protection, the mode selection logic 104 and protection circuit 101 can receive a limit voltage ($V_{LIMIT}$).

In certain examples, the limit voltage ($V_{LIMIT}$) can assist in detecting an overvoltage stress condition and can be used to clamp an input reference voltage level of the power supply 103 to provide overvoltage stress protection when the passgate transistor 102 is in a mode to pass analog signals.

In certain examples, components of the passgate circuit 100 can be coupled to different reference voltages during different operating modes, when the passgate transistor 102 is enabled, and when the passgate transistor 102 is disabled. In certain examples, a low rail supply voltage ($V_{LOW}$) can be received by the passgate circuit 100. In some examples, the low rail supply voltage ($V_{LOW}$) can be the voltage at one of the passgate switch nodes (A, B). In some examples, the low rail supply voltage ($V_{LOW}$) can be ground (GND). In some examples, the low rail supply voltage ($V_{LOW}$) can be a lowest voltage available to the passgate circuit 100. In some examples, the low rail supply voltage ($V_{LOW}$) can be the lowest voltage between the voltage at one of the passgate switch nodes (A, B) or ground (GND). In certain examples, the passgate circuit 100 can include a low voltage discriminator circuit (not shown) to provide the low rail supply voltage ($V_{LOW}$).

In certain examples, a high rail supply voltage ($V_{HIGH}$) can be received by the passgate circuit 100. In some examples, the high rail supply voltage ($V_{HIGH}$) can be the voltage at one of the passgate switch nodes (A, B). In some examples, the high rail supply voltage ($V_{HIGH}$) can be the limit voltage ($V_{LIMIT}$). In some examples, the high rail supply voltage ($V_{HIGH}$) can be one of a number of reference voltages, such as a reference voltage ($V_{USB\_REF}$) for a USB mode of the passgate transistor 102. In some examples, the high rail supply voltage ($V_{HIGH}$) can be a highest voltage available to the passgate circuit 100. In some examples, the high rail supply voltage ($V_{HIGH}$) can be the highest voltage between the voltage at one of the passgate switch nodes (A, B), the limit voltage ($V_{LIMIT}$), a reference voltage, such as a USB mode reference voltage ($V_{USB\_REF}$), an available supply voltage of the circuit ($V_{DD}$) (not shown), or combinations thereof. In certain examples, the passgate circuit can include a high voltage discriminator circuit (not shown) to provide the high rail supply voltage ($V_{HIGH}$).

Figure 2:
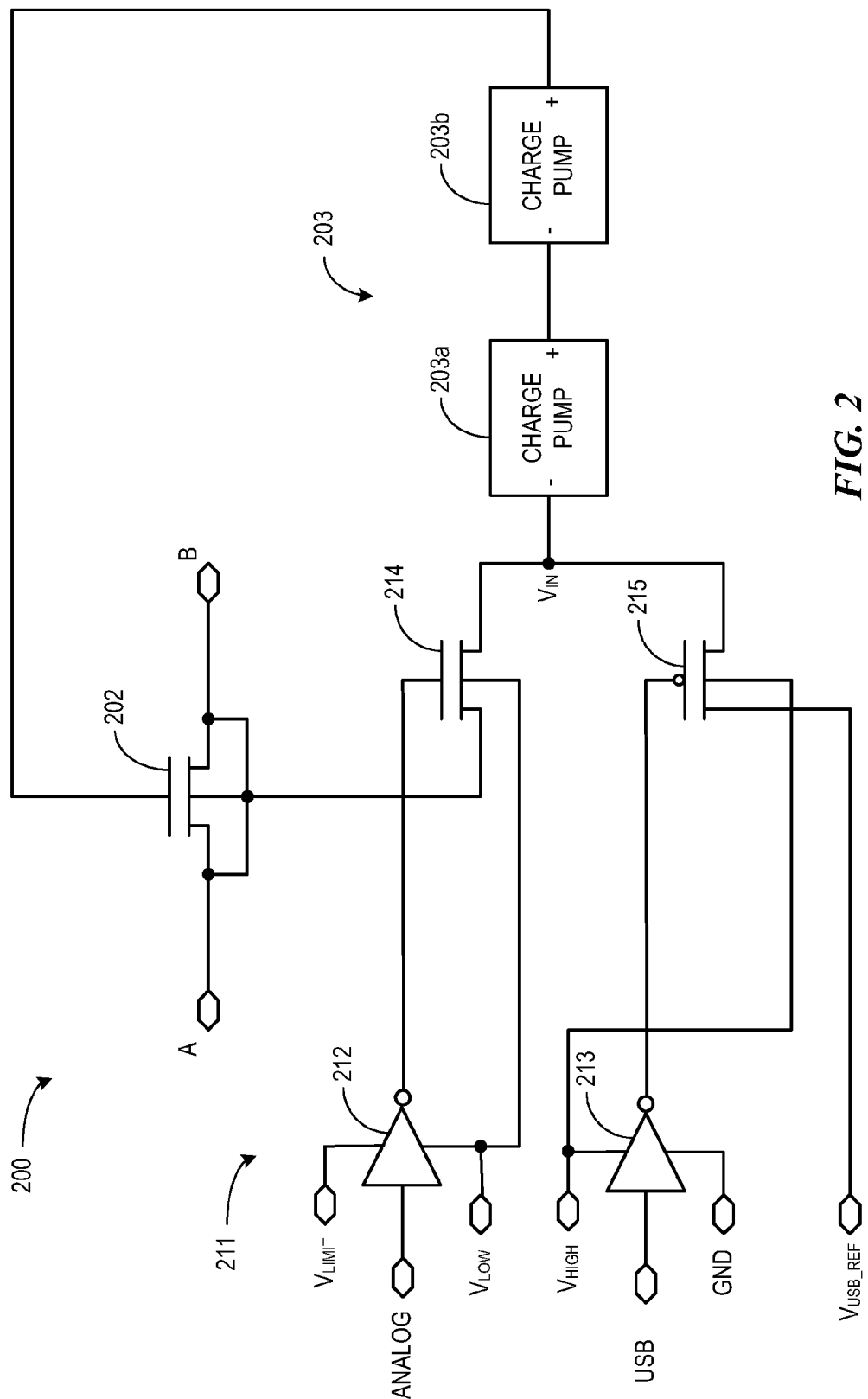
FIG. 2 illustrates generally an example passgate circuit.

FIG. 2 illustrates generally an example passgate circuit 200. In an example, the passgate circuit 200 can include a passgate 202, one or more power supplies 203, and a protective multiplexer 211 for mode selection and overvoltage stress protection. In certain examples, the power supply 203 can include a charge pump for efficient voltage conversion. In some examples, the power supply can include first and second charge pumps 203a, 203b. In certain examples, the first and second charge pumps 203a, 203b can be used to, among other things, to maintain a constant gate-to-source voltage (Vgs) of the passgate 202 when the passgate 202 is enabled. Such an application is discussed in Snowdon, U.S. patent application Ser. No. 13/331,332, filed Dec. 20, 2011, entitled "Constant Vgs Switch" and hereby incorporated herein by reference in its entirety.

In certain examples, the protective multiplexer 211 can include one or more gates 212, 213 to provide a proper mode select signal, and one or more switches, or transistors 214, 215, to provide a reference voltage ($V_{IN}$) to the power supply 203. In certain examples, the reference voltage ($V_{IN}$) to the power supply 203 can be clamped to reduce or avoid overvoltage stress of the passgate 202 or other circuitry coupled to the passgate 202. For example, the passgate circuit 200 can be enabled and selected for operation in an analog mode using a analog select signal (ANALOG). Although the example shows analog mode enabled and selected using a low logic level signal, it is understood that other logic levels and signal types can be used to select and enable an operation mode of the passgate circuit 200, such as the analog mode.

Upon receiving a low, analog select signal (ANALOG), a first inverter 212 can provide a control signal to a first transistor 214 to place the first transistor 214 in a low impedance state. The first transistor 214, in a high impedance state, can isolate one or more of the switch nodes (A, B) of the passgate 202 from the reference input of the power supply 203. The first transistor 214, in the low impedance state, can couple a reference input of the power supply 203 to one or more of the switch nodes (A, B) of the passgate 202. Upon receiving an analog signal, the Vgs of the passgate 202 can remain constant at about VCP1+VCP2 as the reference voltage ($V_{IN}$) for the power supply 203 can ride on top of the signal voltage at the passgate 202. Such an arrangement can allow the passgate 202 to pass an analog signal with little or no distortion. However, when referenced to ground (GND) the gate voltage (Vg) at the gate of the passgate 202, as well as at other components coupled to the gate and the output of the power supply 203, can be about, $$Vg = VCP1 + VCP2 + VSW,$$

where VSW is the voltage of the signal at one of the switch nodes (A, B) of the passgate 202. In certain situations, the gate voltage (Vg) of the passgate 202 can get high enough to cause voltage stress in low voltage components coupled to the gate. Although any voltage can cause voltage stress in an electrical device, voltage stress in this context is voltage stress outside a given rating of a device and voltage stress that can severely reduce the useful lifetime of the device compared to a device operating or subjected to voltages within the given rating. In certain examples, the protective multiplexer 211 including the first inverter 212 and the first transistor 214 can reduce or eliminate the possibility of over voltage stress by clamping the input reference voltage of the power supply 203. In an example, the first inverter 212 can be powered voltage across a low supply rail ($V_{LOW}$) and a limit voltage ($V_{LIMIT}$). As the signal voltage at a node (A, B) of the passgate 202 varies, the input reference voltage ($V_{IN}$) of the power supply 203 can vary with the signal voltage. However, if the signal voltage approaches a transistor threshold, or turn-on, voltage ($V_T$) below the limit voltage ($V_{LIMIT}$), the first transistor 214 can transition into a source follower mode of operation and the input reference voltage ($V_{IN}$) of the power supply 203 can be clamped at the limit voltage ($V_{LIMIT}$) less the turn-on voltage ($V_T$) of the first transistor 214.

In certain examples, components of the passgate circuit 200 can be coupled to different reference voltages during different operating modes, when the passgate transistor 102 is enabled, and when the passgate transistor 102 is disabled. In certain examples, the low rail supply voltage ($V_{LOW}$) can be the voltage at one of the passgate switch nodes (A, B). In some examples, the low rail supply voltage ($V_{LOW}$) can be ground (GND). In some examples, the low rail supply voltage ($V_{LOW}$) can be a lowest voltage available to the passgate circuit 100. In some examples, the low rail supply voltage ($V_{LOW}$) can be the lowest voltage between the voltage at one of the passgate switch nodes (A, B) or ground (GND). In certain examples, the passgate circuit 200 can include a low voltage discriminator circuit (not shown) to provide the low rail supply voltage ($V_{LOW}$). In some examples, the bulk of the first transistor 214 can be coupled to the low rail supply voltage ($V_{LOW}$) to assure the first transistor 214, as well as the passgate 202 remain in a low impedance state when commanded and to stay in a high impedance state when commanded. In certain examples, the changing voltage levels at the switch nodes (A, B) of the passgate 202 can cause unintended leakage at the first transistor 214 without the low rail supply voltage ($V_{LOW}$) coupled to the bulk of the first transistor 214.

In certain examples, the protective multiplexer 211 can include a second gate, such as a second inverter 213, and a second transistor 215. In certain examples, the passgate circuit 100 can be enabled and selected for operation for a digital mode, such as a USB mode, using a USB select signal (USB). Although the example shows USB mode enabled and selected using a high logic level signal, it is understood that other logic levels and signal types can be used to select and enable an operation mode of the passgate circuit 100, such as the USB mode. Upon receiving a high, USB select signal, the second inverter 213 can provide a control signal to the second transistor 215 to place the second transistor 215 in a low impedance state. The second transistor 215, in the low impedance state, can couple a reference input of the power supply 203 to a proper reference voltage for the digital mode selected, for example, a USB mode reference voltage ($V_{USB\_REF}$) for a USB mode. The second transistor 215, in a high impedance state, can isolate a reference voltage for a digital passgate mode from the reference input of the power supply 203.

In certain examples, other digital modes are possible in place of or in addition to a USB mode without departing from the scope of the present subject matter. Such modes can include, but are not limited to, an MHL mode, and activating such modes can include coupling a proper reference to the power supply 203 for that specific mode. For example, a USB reference voltage can be different than an MHL reference voltage because, for example, USB can have a 0.2 volt signal common mode and MHL can have a 2.3 volt signal common mode. In certain examples, the power supply 203, including the first and second charge pumps 203a, 203b, can be programmable to allow for different power supply output voltages alone or in conjunction with a reference voltage received at the second transistor 215, such as a USB mode reference voltage ($V_{USB\_REF}$).

In certain examples, a high rail supply voltage ($V_{HIGH}$) can be received by the passgate circuit 200. In some examples, the high rail supply voltage ($V_{HIGH}$) can be the voltage at one of the passgate switch nodes (A, B). In some examples, the high rail supply voltage ($V_{HIGH}$) can be the limit voltage ($V_{LIMIT}$). In some examples, the high rail supply voltage ($V_{HIGH}$) can be one of a number of reference voltages, such as a reference voltage ($V_{USB\_REF}$) for a USB mode of the passgate transistor 102. In some examples, the high rail supply voltage ($V_{HIGH}$) can be a highest voltage available to the passgate circuit 200. In some examples, the high rail supply voltage ($V_{HIGH}$) can be the highest voltage between the voltage at one of the passgate switch nodes (A, B), the limit voltage ($V_{LIMIT}$), a reference voltage, such as a USB mode reference voltage ($V_{USB\_REF}$), an available supply voltage of the circuit ($V_{DD}$) (not shown), or combinations thereof. In certain examples, the passgate circuit can include a high voltage discriminator circuit (not shown) to provide the high rail supply voltage ($V_{HIGH}$). In some examples, the bulk of the second transistor 215 can be coupled to the high rail supply voltage ($V_{HIGH}$) to assure the first transistor 215, as well as the passgate 202 remain in a low impedance state when commanded and stay in a high impedance state when commanded. In certain examples, the changing voltage levels at the switch nodes (A, B) of the passgate 202 can cause unintended leakage at the second transistor 215 without the high rail supply voltage ($V_{HIGH}$) coupled to the bulk of the second transistor 215.

Figure 3:
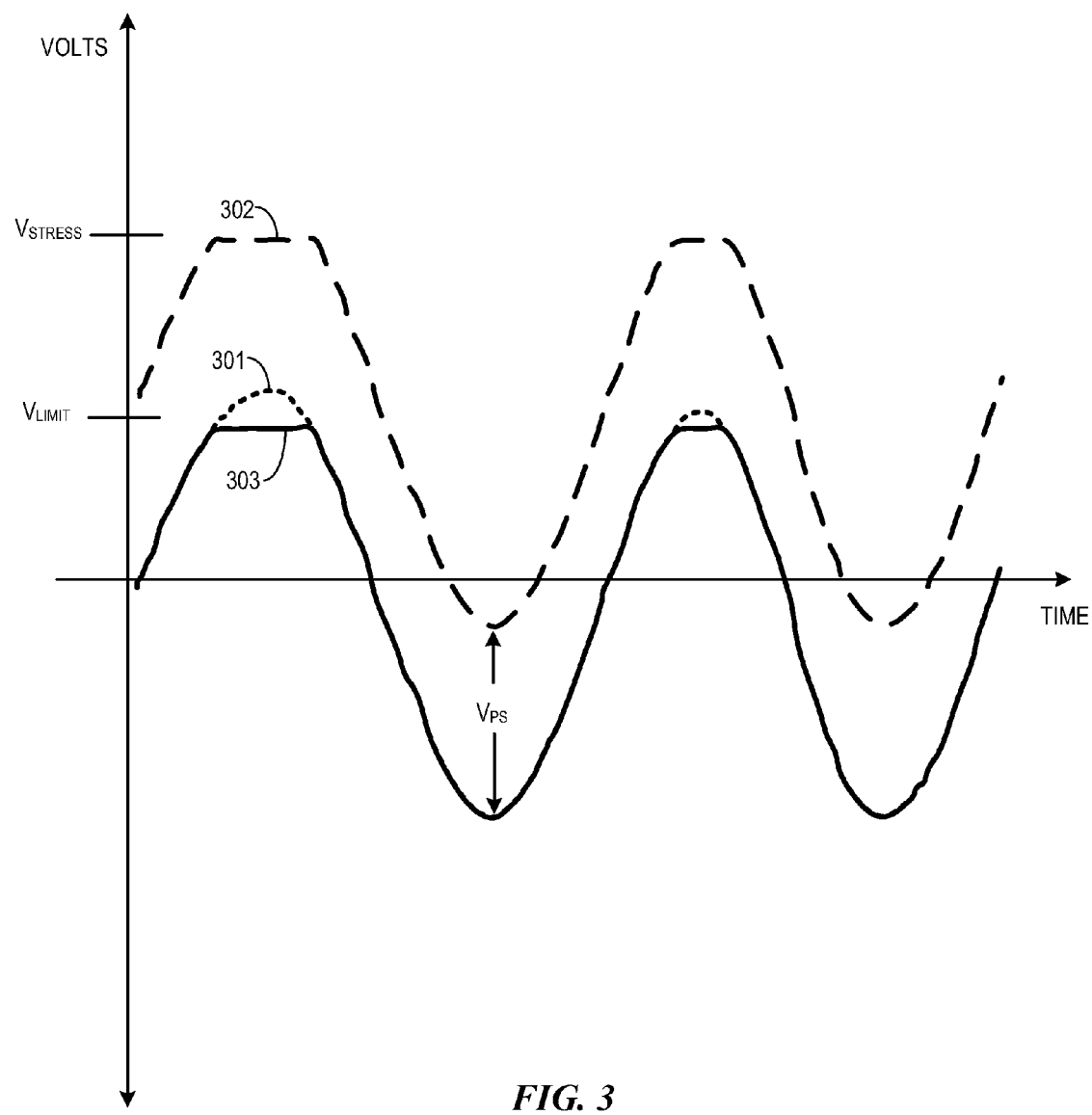
FIG. 3 illustrates generally plots of an example protective multiplexer that reduces or eliminates overvoltage stress to low voltage components of an example passgate circuit.

FIG. 3 illustrates generally a first plot of a signal 301 that could cause overvoltage stress to an example passgate circuit, a second plot of the power supply output 302, or the gate voltage (Vg) at the passgate transistor, when the signal is applied to the passgate circuit when the passgate is enabled to pass the signal 301, and a third plot of the modified signal 303 as modified by an example protective multiplexer to reduce or eliminate overvoltage stress to low voltage components of an example passgate circuit. Note that the gate voltage (Vg) 302 can be limited by a protective multiplexer such that the gate voltage (Vg) of the passgate does not rise above an over-stress voltage ($V_{STRESS}$). In certain examples, the over-stress voltage ($V_{STRESS}$) can be the voltage across the power supply ($V_{PS}$) plus the limit voltage ($V_{LIMIT}$).

ADDITIONAL NOTES

In Example 1, a protective multiplexer circuit, having a first state and a second state, configured to provide an input reference voltage at an input of a power supply of a passgate, the passgate having first and second signal nodes and a control node, the control node configured to receive a control voltage from the power supply, the control voltage referenced to the input of the power supply. The protective multiplexer circuit can include a first switch, in the first state, configured to couple the input of the power supply to at least one of the first or second signal nodes when a first voltage of the at least one of the first or second signal nodes is below a first limit voltage.

In Example 2, the first switch of Example 1, in the first state, is optionally configured to provide a second limit voltage as the input reference voltage when the first voltage is above the first limit voltage, wherein the second limit voltage is the first limit voltage less a turn-on voltage of the first switch.

In Example 3, the first switch of any one or more of Examples 1-2 optionally includes a first transistor.

In Example 4, a bulk of the first transistor of any one or more of Examples 1-3 optionally is configured to receive the lesser voltage of the limit voltage and the first voltage.

In Example 5, the first transistor of any one or more of Examples 1-4, in the first state, is optionally configured as a source follower when the first voltage is above the first limit voltage, and the first limit voltage is present at a source node of the first transistor.

In Example 6, the first switch of any one or more of Examples 1-5, in a second state, is optionally configured to isolate the first and second signal nodes from the power supply.

In Example 7, the protective multiplexer circuit of any one or more of Examples 1-6 optionally includes a second switch, the second switch, in the second state, configured to couple the input of the power supply to a third voltage, the third voltage different than the first voltage and different from the first limit voltage.

In Example 8, the second switch of any one or more of Examples 1-7, in the first state, is optionally configured to isolate the input of the power supply from the third voltage.

In Example 9, the second switch of any one or more of Examples 1-8 optionally includes a second transistor.

In Example 10, a bulk of the second transistor of any one or more of Examples 1-9 optionally is configured to receive the higher voltage of the first voltage, the first limit voltage, and the third voltage.

In Example 11, a method of operating a passgate having an analog mode and a Universal Serial Bus (USB) mode, the passgate having first and second signal nodes and a control node, the control node configured to receive a control voltage from a power supply, the control voltage referenced to an input of the power supply, the method can include coupling the input of the power supply to at least one of the first or second signal nodes when a first voltage of the at least one of the first or second signal nodes is below a first limit voltage using a first switch when the passgate is in the analog mode.

In Example 12, the method of any one or more of Examples 1-11 optionally includes providing a second limit voltage at the input of the power supply when the first voltage of the at least one of the first or second signal nodes is above the first limit voltage, wherein the second limit voltage is the first limit voltage less a turn-on voltage of the first switch.

In Example 13, the first switch of any one or more of Examples 1-12 optionally includes a first transistor, and the method of any one or more of examples 1-12 optionally includes receiving at a bulk of the first transistor the lesser voltage of the first limit voltage and the first voltage.

In Example 14, the method of any one or more of Examples 1-13 optionally includes operating the first transistor during the analog mode as a source follower when the first voltage is above the first limit voltage, and the limit voltage is present at a source node of the first transistor.

In Example 15, the method of any one or more of Examples 1-14 optionally includes isolating the first and second signal nodes from the input of the power supply during the USB mode using the first switch.

In Example 16, The method of any one or more of Examples 1-15 optionally includes coupling the input of the power supply to a third voltage in the USB mode using a second switch, the third voltage different than the first voltage and different from the first limit voltage.

In Example 17, the method of any one or more of Examples 1-16 optionally includes isolating the input of the power supply from the third voltage in the analog mode using the second switch.

In Example 18, the second switch of any one or more of Examples 1-17 optionally includes a second transistor, and the method of any one or more of Examples 1-17 optionally includes receiving at a bulk of the second transistor the higher voltage of the first voltage, the first limit voltage, and the third voltage.

In Example 19, a system can include a passgate having first and second signal nodes and a control node, the passgate configured to pass a signal between the first and second signal nodes when enabled and to isolate the first and second signal nodes from each other when disabled, a power supply configured to provide a control voltage to the control node, the control voltage referenced to an input of the power supply, and a protective multiplexer circuit, having a first state and a second state, configured to provide an input reference voltage at an input of the power supply. The protective multiplexer circuit can include a first transistor, in the first state, configured to couple the input of the power supply to at least one of the first or second signal nodes when a first voltage of the at least one of the first or second signal nodes is below a first limit voltage, and to provide a second limit voltage at the input of the power supply when the first voltage of the at least one of the first or second signal nodes is above the first limit voltage, wherein the second limit voltage is the first limit voltage less a turn-on voltage of the first transistor, the first transistor, in the second state, configured to isolate the first and second signal nodes from the power supply, and to receive the lesser voltage of the first limit voltage and the first voltage at a bulk node, and a second transistor configured, in the second state, to couple the input of the power supply to a third voltage, in the first state, to isolate the input of the power supply from the third voltage, and to receive in a bulk of the second transistor is configured to receive, at a bulk node of the second transistor, the higher voltage of the first voltage, the first limit voltage, and the third voltage, wherein the third voltage is different than the first voltage and different than the first limit voltage.

In Example 20, the power supply of any one or more of Examples 1-19 optionally includes first and second charge pumps.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, although examples above have been described relating to a particular transistor type, such as PNP devices, one or more examples can be applicable to NPN devices, and vice versa without departing from the scope of the present subject matter. In other examples, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A protective multiplexer circuit, having a first state and a second state, configured to provide an input reference voltage at an input of a power supply of a passgate, the passgate having first and second signal nodes and a control node, the control node configured to receive a control voltage from the power supply, the control voltage referenced to the input of the power supply, the protective multiplexer circuit comprising:
    a first switch, in the first state, configured to couple the input of the power supply to at least one of the first or second signal nodes when a first voltage of the at least one of the first or second signal nodes is below a first limit voltage; and
    wherein the first switch, in the first state, is configured to provide a second limit voltage as the input reference voltage when the first voltage is above the first limit voltage, wherein the second limit voltage is the first limit voltage less a turn-on voltage of the first switch.

2. The protective multiplexer circuit of claim 1, wherein the first switch includes a first transistor.

3. The protective multiplexer circuit of claim 2, wherein a bulk of the first transistor is configured to receive the lesser voltage of the limit voltage and the first voltage.

4. The protective multiplexer circuit of claim 2, wherein the first transistor, in the first state, is configured as a source follower when the the first voltage is above the first limit voltage, and the first limit voltage is present at a source node of the first transistor.

5. The protective multiplexer circuit of claim 1, wherein the first switch, in a second state, is configured to isolate the first and second signal nodes from the power supply.

6. The protective multiplexer circuit of claim 1, including a second switch, the second switch, in the second state, configured to couple the input of the power supply to a third voltage, the third voltage different than the first voltage and different from the first limit voltage.

7. The protective multiplexer circuit of claim 6, wherein the second switch, in the first state, is configured to isolate the input of the power supply from the third voltage.

8. The protective multiplexer circuit of claim 6, wherein the second switch includes a second transistor.

9. The protective multiplexer circuit of claim 6, wherein a bulk of the second transistor is configured to receive the higher voltage of the first voltage, the first limit voltage, and the third voltage.

10. A method of operating a passgate having an analog mode and a Universal Serial Bus (USB) mode, the passgate having first and second signal nodes and a control node, the control node configured to receive a control voltage from a power supply, the control voltage referenced to an input of the power supply, the method comprising:
coupling the input of the power supply to at least one of the first or second signal nodes when a first voltage of the at least one of the first or second signal nodes is below a first limit voltage using a first switch when the passgate is in the analog mode; and
providing a second limit voltage at the input of the power supply when the first voltage of the at least one of the first or second signal nodes is above the first limit voltage, wherein the second limit voltage is the first limit voltage less a turn-on voltage of the first switch.

11. The method of claim 10, wherein the first switch includes a first transistor; and
wherein the method includes receiving at a bulk of the first transistor the lesser voltage of the first limit voltage and the first voltage.

12. The method of claim 11, including operating the first transistor during the analog mode as a source follower when the the first voltage is above the first limit voltage, and the limit voltage is present at a source node of the first transistor.

13. The method of claim 10, including isolating the first and second signal nodes from the input of the power supply during the USB mode using the first switch.

14. The method of claim 10, including coupling the input of the power supply to a third voltage in the USB mode using a second switch, the third voltage different than the first voltage and different from the first limit voltage.

15. The method of claim 14, including isolating the input of the power supply from the third voltage in the analog mode using the second switch.

16. The method of claim 15, wherein the second switch includes a second transistor; and
wherein the method includes receiving at a bulk of the second transistor the higher voltage of the first voltage, the first limit voltage, and the third voltage.

17. A system comprising:
a passgate having first and second signal nodes and a control node, the passgate configured to pass a signal between the first and second signal nodes when enabled and to isolate the first and second signal nodes from each other when disabled;
a power supply configured to provide a control voltage to the control node, the control voltage referenced to an input of the power supply; and
a protective multiplexer circuit, having a first state and a second state, configured to provide an input reference voltage at an input of the power supply, the protective multiplexer circuit including:
a first transistor, in the first state, configured to couple the input of the power supply to at least one of the first or second signal nodes when a first voltage of the at least one of the first or second signal nodes is below a first limit voltage, and to provide a second limit voltage at the input of the power supply when the first voltage of the at least one of the first or second signal nodes is above the first limit voltage, wherein the second limit voltage is the first limit voltage less a turn-on voltage of the first transistor.
the first transistor, in the second state, configured to isolate the first and second signal nodes from the power supply, and to to receive the lesser voltage of the first limit voltage and the first voltage at a bulk node; and
a second transistor configured, in the second state, to couple the input of the power supply to a third voltage, in the first state, to isolate the input of the power supply from the third voltage, and to receive in a bulk of the second transistor is configured to receive, at a bulk node of the second transistor, the higher voltage of the first voltage, the first limit voltage, and the third voltage, wherein the third voltage is different than the first voltage and different than the first limit voltage.

18. The system of claim 17, wherein the power supply includes first and second charge pumps.

* * * * *